United States Patent
Hull Roskos

(10) Patent No.: US 8,924,174 B2
(45) Date of Patent: Dec. 30, 2014

(54) DETERMINING POWER FLOW

(75) Inventor: Julie J. Hull Roskos, Forest Lake, MN (US)

(73) Assignee: Honeywell International Inc., Morristown, NJ (US)

( * ) Notice: Subject to any disclaimer, the term of this patent is extended or adjusted under 35 U.S.C. 154(b) by 624 days.

(21) Appl. No.: 13/186,089

(22) Filed: Jul. 19, 2011

(65) Prior Publication Data

US 2013/0024145 A1 Jan. 24, 2013

(51) Int. Cl.
G01R 25/00 (2006.01)
G01K 13/00 (2006.01)
G01R 21/02 (2006.01)

(52) U.S. Cl.
CPC ............ *G01K 13/00* (2013.01); *G01R 21/02* (2013.01)
USPC ............ 702/65; 702/66; 702/75; 702/79

(58) Field of Classification Search
USPC ............ 702/65–66, 75, 79; 331/70, 176
See application file for complete search history.

(56) References Cited

U.S. PATENT DOCUMENTS 5,525,936 A * 6/1996 Post et al. ............ 331/47
6,639,402 B2 * 10/2003 Grimes et al. .......... 324/239
7,679,463 B2 * 3/2010 Pernia et al. ........ 331/108 C

OTHER PUBLICATIONS

Lumasense Technologies, Fiber Optic Temperature Sensors, http://www.lumasenseinc.com/EN/products/fluoroptic-temperature-sensors/, 2011, accessed from website Jul. 19, 2011 (2 pgs.).

* cited by examiner

*Primary Examiner* — Elias Desta
(74) *Attorney, Agent, or Firm* — Brooks, Cameron & Huebsch, PLLC

(57) ABSTRACT

Methods, systems, and devices for determining a power flow are described herein. One method includes determining a temperature of a circuit conductor while the circuit conductor is conducting a current, and determining a power flow associated with the circuit conductor based, at least in part, on the determined temperature.

17 Claims, 1 Drawing Sheet

US 8,924,174 B2

DETERMINING POWER FLOW

TECHNICAL FIELD

The present disclosure relates to methods, systems, and devices for determining power flow.

BACKGROUND

Power flow through an electric grid can be unpredictable and difficult to determine. For instance, after a disturbance to the grid, the power flow through the grid may be rerouted, but the direction of the power flow at, for example, grid interconnections may not be readily apparent.

However, determining power flow through an electric grid (e.g., determining an amount of power flow and/or a direction of power flow) can be economically beneficial, especially as electric power grids become more automated. For example, determining an amount of power flow through a grid can allow power loads on the grid to be kept below capacities. Additionally, determining direction of power flow through a grid can allow power systems analysis applications to determine low-cost (e.g., optimized) operation settings for the power grid.

Power flow through a grid can be determined using, for example, a voltmeter and a magnetic dipole, and/or a directional field meter at interconnections of the grid. However, because a grid can have many interconnections, these techniques can be expensive and/or invasive.

DETAILED DESCRIPTION

Methods, systems, and devices for determining a power flow are described herein. One or more method embodiments include determining a temperature of a circuit conductor while the circuit conductor is conducting a current, and determining a power flow associated with the circuit conductor based, at least in part, on the determined temperature.

One or more embodiments of the present disclosure can determine power flow in a low cost and/or non-invasive manner. Additionally, one or more embodiments of the present disclosure can determine an amount and/or direction of a power flow. Further, one or more embodiments of the present disclosure can communicate a determined power flow to a user device.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of temperature sensors" can refer to one or more temperature sensors.

Figure 1:
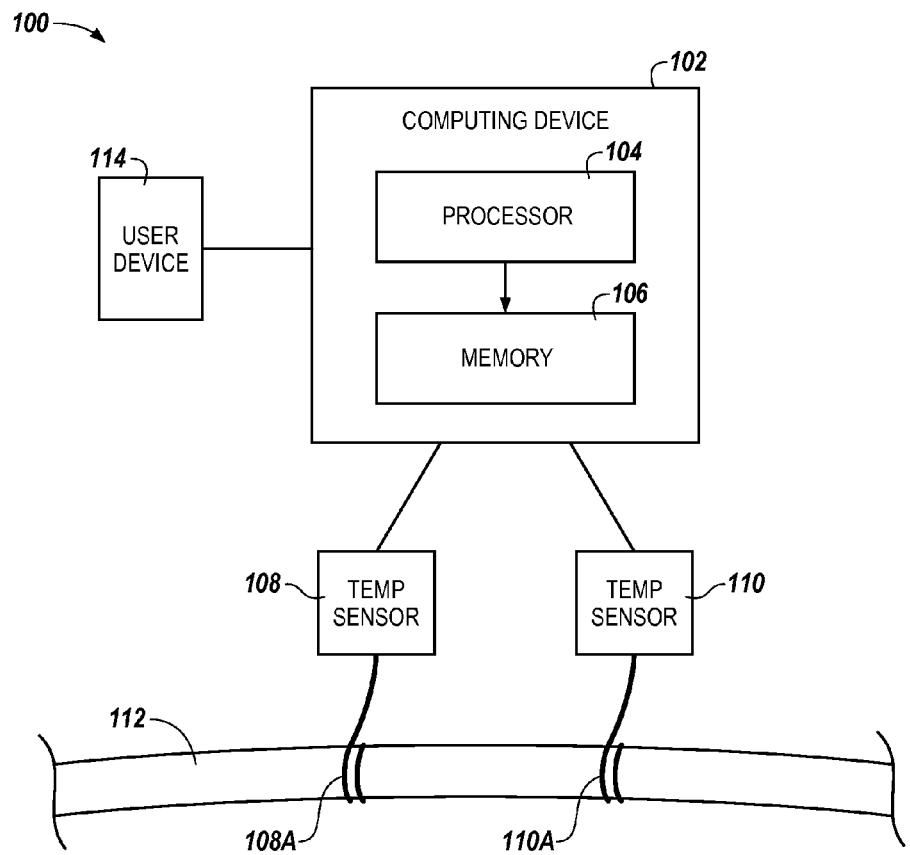
FIG. 1 is a block diagram illustrating a system for determining a power flow in accordance with one or more embodiments of the present disclosure.

FIG. 1 illustrates a system 100 for determining a power flow in accordance with one or more embodiments of the present disclosure. As shown in FIG. 1, system 100 includes a computing device 102 communicatively coupled to user device 114, and temperature sensors 108 and 110. A communicative coupling can include wired and/or wireless connections and/or networks such that data can be transferred in any direction between computing device 102, user device 114, and temperature sensors 108 and 110.

As shown in FIG. 1, temperature sensors 108 and 110 can each include a data acquisition portion (DAP) 108a and DAP 110a that are coupled to (e.g., surround) a circuit conductor 112. The DAPs 108a and 110a can, independently or in combination, sense (e.g., acquire, detect, and/or measure) temperature data associated with circuit conductor 112. Additionally, although two temperature sensors are shown in FIG. 1, system 100 can include any number of temperature sensors and/or any number of DAPs associated with the temperature sensor(s).

In the embodiment illustrated in FIG. 1, DAPs 108a and 1110a include filaments (e.g., filaments including a number of optical fibers) wrapped around circuit conductor 112 to sense temperature data associated with circuit conductor 112. However, temperature sensors 108 and 110 can be any type of device that can sense temperature data associated with circuit conductor 112. Moreover, embodiments of the present disclosure do not limit DAP 108a and/or DAP 110a to positions surrounding circuit conductor 112; rather, DAP 108a and/or DAP 110a can be positioned in any configuration suitable for temperature sensing, including, for example, substantially parallel to a longitudinal axis of circuit conductor 112. Further, embodiments of the present disclosure do not limit DAP 108a and/or DAP 110a to positions that contact circuit conductor 112; rather, DAP 108a and/or DAP 110a can sense a temperature of circuit conductor 112 without contacting it, for example, by sensing infrared radiation of circuit conductor 112.

Circuit conductor 112 can be, include, and/or be a part of, for example, a wire, a cable, a circuit breaker, a transformer, a generator, a battery charger, an electronic ballast, a variable frequency drive (VFD), a capacitor, a rectifier with a capacitor input filter and/or combinations of these circuit conductors and/or others. Embodiments of the present disclosure do not limit circuit conductor 112 to a particular type of circuit conductor; rather, circuit conductor 112 can be any circuit conductor through which power can flow.

As shown in FIG. 1, computing device 102 includes a processor 104 and a memory 106. As shown in FIG. 1, memory 106 can be coupled to processor 104.

Memory 106 can be volatile or nonvolatile memory. Memory 106 can also be removable (e.g., portable) memory, or non-removable (e.g., internal) memory. For example, memory 106 can be random access memory (RAM) (e.g., dynamic random access memory (DRAM), and/or phase change random access memory (PCRAM)), read-only memory (ROM) (e.g., electrically erasable programmable read-only memory (EEPROM), and/or compact-disk read-only memory (CD-ROM)), flash memory, a laser disk, a digital versatile disk (DVD), and/or other optical disk storage), and/or a magnetic medium such as magnetic cassettes, tapes, or disks, among other types of memory.

Further, although memory 106 is illustrated as being located in computing device 102, embodiments of the present disclosure are not so limited. For example, memory 106 can also be located internal to another computing resource, e.g., enabling computer readable instructions to be downloaded over the Internet or another wired or wireless connection.

Memory 106 can also store executable instructions, such as, for example, computer readable instructions (e.g., software), for determining a power flow in accordance with one or more embodiments of the present disclosure. For example, memory 106 can store executable instructions for determining a power flow associated with circuit conductor 112 based, at least in part, on a determined temperature of circuit conductor 112 in accordance with one or more embodiments of the present disclosure. Memory 106 can store the determined power flow.

Processor 104 can execute the executable instructions stored in memory 106 to determine a power flow in accordance with one or more embodiments of the present disclosure. For example, processor 104 can execute the executable instructions stored in memory 106 to determine a power flow associated with circuit conductor 112 based, at least in part, on a determined temperature of circuit conductor 112 in accordance with one or more embodiments of the present disclosure.

User device 114 can be a computing device analogous to computing device 102. However, embodiments of the present disclosure do not limit user device 114 to a particular type of device. For example, user device 114 can be a mobile device (e.g., a cellular telephone, and/or a personal digital assistant (PDA), among other mobile devices).

Temperature sensor 108 and/or 110 can determine (e.g., sense) a temperature of circuit conductor 112 (e.g., a temperature of a portion of circuit conductor 112). For example, temperature sensors 108 and 110 can determine the temperature of circuit conductor 112 using temperature data associated with circuit conductor 112 sensed by DAPs 108a and 110a.

Temperature sensor 108 and/or 110 can additionally determine conditions (e.g., environmental conditions) adjacent to (e.g., surrounding) circuit conductor 112. Conditions adjacent to circuit conductor 112 can include, for example, ambient temperature, solar index, and/or humidity, among other environmental conditions. Such conditions can be determined by temperature sensor 108 and/or 110, as previously discussed, and/or can be determined by another means, such as, for example, a number of additional sensors and/or sources.

Computing device 102 can receive the determined temperature(s) from temperature sensor 108 and/or 110 and determine a power flow (e.g., an amount and/or direction of power flow) associated with (e.g., through) circuit conductor 112 based, at least in part, on the determined temperature. Embodiments of the present disclosure do not limit computing device 102 to determining power flow based solely on temperatures. For example, computing device 102 can additionally receive a determined current and/or voltage being conducted by the circuit conductor from any suitable source, including, for example, a current meter and/or a multimeter (not shown in FIG. 1), and determine a power flow associated with circuit conductor 112 based, at least in part, on the determined current. Additionally, computing device 102 can determine power flow based on the conditions adjacent to circuit conductor 112, previously discussed.

An increased temperature can, for example, indicate the presence of a power flow through circuit conductor 112. Computing device 102 can determine an amount of the power flow based on a particular temperature of circuit conductor 112. For example, in an absence of a power flow, a temperature of circuit conductor 112 can be substantially equal to an ambient temperature surrounding circuit conductor 112. As power flows through circuit conductor 112, the temperature of circuit conductor 112 can increase to a higher temperature (e.g., the more power that flows through circuit conductor 112, the greater the temperature of circuit conductor 112).

Computing device 102 can receive temperature data from multiple temperature sensors (e.g., temperature sensors 108 and 110, among others) to determine, for example, a direction of a power flow associated with circuit conductor 112. For example, temperature sensor 108 can determine a temperature spike, and subsequently, temperature sensor 110 can determine a temperature spike. Computing device 102 can determine that, based on the timing of the spikes, power is flowing in a direction from temperature sensor 108 to temperature sensor 110.

As an additional example, temperature sensors 108 and 110 can determine a same first temperature associated with circuit conductor 112. Subsequently, temperature sensor 108 can determine a second (e.g., increased) temperature associated with circuit conductor 112. Thereafter, temperature sensor 110 can determine the same second temperature associated with circuit conductor 112. From these determinations, computing device 102 can determine that a power flow associated with circuit conductor is moving in a direction from temperature sensor 108 to temperature sensor 110.

Temperature sensors 108 and/or 110 can communicate determined temperatures at a predetermined interval (e.g., once per millisecond) to computing device 102 and/or can communicate determined temperatures that exceed a threshold to computing device 102. For example, temperature sensors 108 and 110 can communicate a determined temperature spike to computing device 102.

As previously discussed, computing device 102 can receive environmental data associated with an area adjacent to circuit conductor 112. Environmental data can, for example, be compared with determined temperatures of circuit conductor 112 to determine whether a change in temperature associated with circuit conductor 112 is caused by a power flow associated with circuit conductor 112, or a change in temperature in the area adjacent to circuit conductor 112. For example, computing device 102 can determine that a temperature spike determined by temperature sensor 110 is caused by an increase in ambient temperature, rather than by a power flow associated with circuit conductor 112.

As previously discussed, computing device 102 includes memory 106 which can store determined power flows. Computing device 102 can determine a power flow associated with circuit conductor 112, and compare the determined power flow with historical data relating to, for example, determined temperatures and/or power flows stored in memory 106. In addition, memory 106 can store temperature data that computing device 102 can use to determine whether temperature data (e.g., newly-acquired temperature data from temperature sensor 108 and/or 110) indicates the presence of one or more power flows. Continuing in the example, memory 106 can store temperature data that computing device 102 can use to determine a direction of a power flow.

Historical data can also be used by computing device 102 to determine whether to communicate the determined power flow to user device 114. For example, computing device 102 may not communicate all determined power flows to user device 114. Computing device 102 can store a threshold in memory 106 such that only a determined power flow that exceeds the threshold is communicated to user device 114. For example, computing device 102 can be configured to communicate only power flows above a certain level, and/or in a particular direction to user device 114.

User device 114 can receive the determined power flow from computing device 102 and can, for example, display the determined power flow to a user. Embodiments of the present disclosure do not limit user device 114 to a particular type of display and/or graphic depiction. For example, user device 114 can display that a power flow has been determined by computing device 102 and/or can display the direction of the determined power flow within circuit conductor 112 via a diagram of circuit conductor 112. User device 114 can display the determined power flow along with a number of options, including, for example, "shut down," "ignore," "monitor," etc. As previously discussed, embodiments of the present disclosure do not limit user device 114 to a particular type of device. For example, user device 114 can be a terminal in a power substation, a mobile device, a personal computer, etc. Although shown as a single device in FIG. 1, embodiments of the present disclosure can include multiple user devices in system 100.

Figure 2:
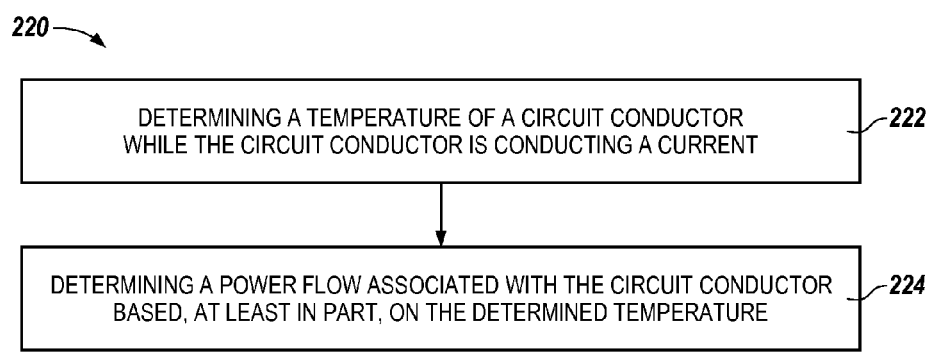
FIG. 2 illustrates a method for determining a power flow in accordance with one or more embodiments of the present disclosure.

FIG. 2 illustrates a method 220 for determining a power flow in accordance with one or more embodiments of the present disclosure. Method 220 can be performed, for example, by computing device 102 previously discussed in connection with FIG. 1.

At block 222, method 220 includes determining a temperature of a circuit conductor (e.g., circuit conductor 112 previously described in connection with FIG. 1) while the circuit conductor is conducting a current. The temperature of the circuit conductor can be determined, for example, through the use of one or more temperature sensors (e.g., temperature sensors 108 and/or 110 previously discussed in connection with FIG. 1) in a manner such as that previously discussed in connection with FIG. 1.

At block 224, method 220 includes determining a power flow associated with the circuit conductor based, at least in part, on the determined temperature. The power flow can be determined in a manner analogous to that previously discussed in connection with FIG. 1.

Although not shown in FIG. 2, method 220 can include determining a temperature of an environment adjacent to (e.g., surrounding) the circuit conductor and determining a direction of a power flow based, at least in part, on the temperatures of a first portion of the circuit conductor, a second portion of the circuit conductor, and the environment in a manner analogous to that previously discussed in connection with FIG. 1.

Although not shown in FIG. 2, method 220 can include determining a humidity of an environment surrounding the circuit conductor, and determining a power flow associated with the circuit conductor based, at least in part, on the determined temperature and the determined humidity of the environment surrounding the circuit conductor in a manner analogous to that previously discussed in connection with FIG. 1.

Although not shown in FIG. 2, method 220 can include determining a temperature of a portion of the circuit conductor, and determining a temperature of a second portion of the circuit conductor, and determining a direction of the power flow of the circuit conductor based, at least in part, on the temperatures of the first and second portions of the circuit conductor in a manner analogous to that previously discussed in connection with FIG. 1.

Although not shown in FIG. 2, method 220 can include determining a temperature of a first portion of the circuit conductor, determining a temperature of a second portion of the circuit conductor, determining a temperature of an environment surrounding the circuit conductor, and determining a location of the power flow based, at least in part, on the temperatures of the first portion of the circuit conductor, the second portion of the circuit conductor, and the environment in a manner analogous to that previously discussed in connection with FIG. 1.

Although not shown in FIG. 2, method 220 can include determining whether the determined power flow exceeds a historical threshold in a manner analogous to that previously discussed in connection with FIG. 1. Although not shown in FIG. 2, method 220 can include communicating the power flow to a user device in a manner analogous to that previously discussed in connection with FIG. 1.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for determining a power flow, comprising:
   determining, by a processor, a temperature of a first portion of a circuit conductor using a device while the circuit conductor is conducting a current, wherein the device does not conduct the current;
   determining, by a processor, a temperature of a second portion of the circuit conductor while the circuit conductor is conducting the current using a device; and
   determining, by a processor, a direction of a power flow associated with the circuit conductor based, at least in part, on the determined temperatures of the first and second portions of the circuit conductor.

2. The method of claim 1, wherein the method includes:
   determining a humidity of an environment adjacent to the circuit conductor; and
   determining the power flow associated with the circuit conductor based, at least in part, on the determined temperatures and the determined humidity.

3. The method of claim 1, wherein the method includes:
  determining a temperature of an environment adjacent to the circuit conductor; and
  determining the direction of the power flow based, at least in part, on the temperatures of the first portion of the circuit conductor, the second portion of the circuit conductor, and the environment adjacent to the circuit conductor.

4. The method of claim 1, wherein the method includes determining whether the power flow exceeds a historical threshold.

5. The method of claim 1, wherein the method includes communicating the power flow to a user device.

6. A system comprising:
  a first temperature sensor configured to determine a temperature of a first portion of a circuit conductor while the circuit conductor is conducting a current, wherein the first temperature sensor does not conduct the current;
  a second temperature sensor configured to determine a temperature of a second portion of the circuit conductor while the circuit conductor is conducting the current, wherein the second temperature sensor does not conduct the current; and
  a computing device configured to:
    receive the temperature of the first portion of the circuit conductor from the first temperature sensor;
    receive the temperature of the second portion of the circuit conductor from the second temperature sensor; and
    determine a direction of a power flow associated with the circuit conductor based, at least in part, on the temperatures of the first and second portions of the circuit conductor.

7. The system of claim 6, wherein the circuit conductor is a wire.

8. The system of claim 6, wherein the circuit conductor is one of a transformer, a capacitor, and a power grid interconnection.

9. The system of claim 6, wherein the first and second temperature sensors are each configured to determine the temperatures of the first and second portions of the circuit conductor at a predetermined interval.

10. The system of claim 6, wherein the first and second temperature sensors are each configured to communicate a determined temperature that exceeds a threshold to the computing device.

11. The system of claim 6, wherein a portion of the temperature sensor surrounds a portion of the circuit conductor.

12. The system of claim 6, wherein the temperature sensor is positioned parallel to a longitudinal axis of the circuit conductor.

13. A computing device for determining a power flow, comprising:
  a memory; and
  a processor coupled to the memory, wherein the processor is configured to execute executable instructions stored in the memory to:
    receive temperature data associated with a first portion and a second portion of a circuit conductor and respectively determined by a first device and a second device, wherein the temperature data includes temperature data associated with the circuit conductor while the circuit conductor conducts a current, and wherein the first device and second device do not conduct the current; and
    determine a direction of a power flow associated with the circuit conductor based, at least in part, on the received temperature data.

14. The computing device of claim 13, wherein the processor is configured to execute executable instructions stored in the memory to determine that temperature data indicating an increased temperature of the circuit conductor is associated with the determined power flow.

15. The computing device of claim 13, wherein the processor is configured to execute executable instructions stored in the memory to display the direction of the determined power flow.

16. The computing device of claim 13, wherein the memory is configured to store the direction of the determined power flow.

17. The computing device of claim 13, wherein the processor is configured to execute executable instructions stored in the memory to determine whether the determined power flow exceeds a threshold stored in the memory.

* * * * *